(12) United States Patent
Arnold et al.

(10) Patent No.: US 6,209,532 B1
(45) Date of Patent: Apr. 3, 2001

(54) SOFT HANDLING PROCESS TOOLING FOR LOW AND MEDIUM VOLUME KNOWN GOOD DIE PRODUCT

(75) Inventors: Richard W. Arnold, McKinney; Lester L. Wilson, Sherman, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/500,519

(22) Filed: Feb. 9, 2000

(51) Int. Cl.[7] .................................................... B28D 1/04
(52) U.S. Cl. ......................... 125/13.01; 125/35; 451/339
(58) Field of Search ................... 125/13.01, 35, 125/12, 20, 23.02; 451/339

(56) References Cited

U.S. PATENT DOCUMENTS

| | | | |
|---|---|---|---|
| 3,809,050 | * 5/1974 | Chough et al. | 125/35 |
| 4,138,304 | * 2/1979 | Gantley | 125/13.01 |
| 4,167,174 | * 9/1979 | Hampton et al. | 125/13.01 |
| 4,407,262 | * 10/1983 | Wirz et al. | 125/35 |
| 4,521,995 | * 6/1985 | Sekiya | 125/35 |
| 6,006,739 | * 12/1999 | Akram et al. | 125/13.01 |
| 6,067,977 | * 5/2000 | Wark et al. | 125/13.01 |
| 6,112,740 | * 9/2000 | Wark et al. | 125/35 |

\* cited by examiner

Primary Examiner—Derris H. Banks
(74) Attorney, Agent, or Firm—Wade James Brady, III; Frederick J. Telecky, Jr.

(57) ABSTRACT

A method of transferring a semiconductor die from a wafer containing a plurality of semiconductor dice. There is provided a semiconductor wafer having a top side and an opposing bottom side and a plurality of dice formed therein, each die containing a portion of the top side and the opposing bottom side. The wafer is removably secured to a support and the wafer is operated upon to form individual dice on the support. The support is preferably a flexible film. A tool is disposed between the support and the bottom side of a the die by creating a vacuum between the tool and the bottom side to cause adherence of the die to the tool and the die is removed from the support with the tool and placed in a die carrier with the top side facing the carrier and the vacuum is then released. The film, when flexible, is stretched to separate the dice from each other and create streets between adjacent dice so that the tool can be disposed under the die from the street. The tool preferably includes an inclined surface with a port exiting at the surface extending through and out of the tool, the vacuum being created at the port and the inclined surface contacting the bottom side of the die. Prior to operation with the tool, a lifting member can impinge against the die bottom through the support to separate a portion of the die from the support, the tool entering beneath the die at the portion of the die removed from the support. The carrier preferably includes a carrier base having a plurality of vacuum ports and an air transmissive lint-free layer over the vacuum ports with the top side of the die abutting the lint-free layer, the die being disposed over one of the vacuum ports.

18 Claims, 3 Drawing Sheets

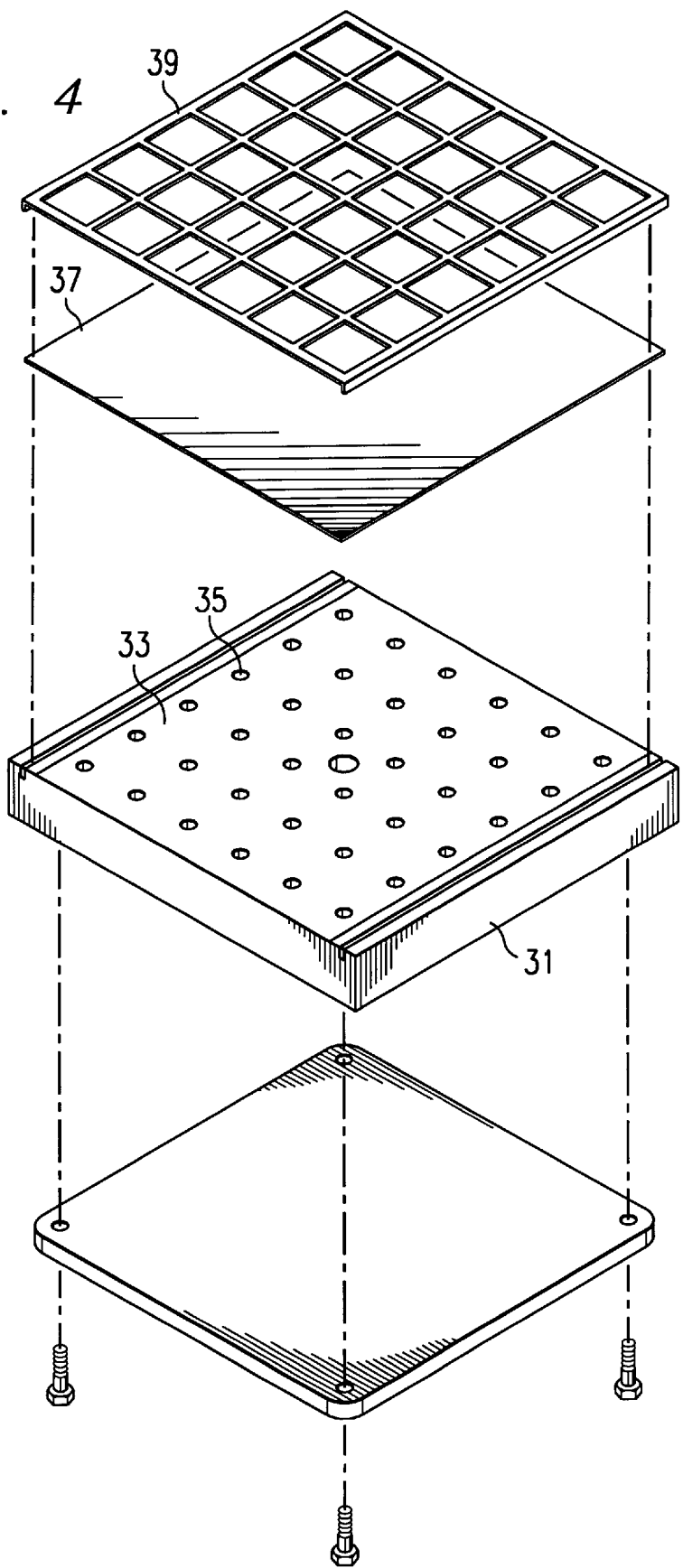

SOFT HANDLING PROCESS TOOLING FOR LOW AND MEDIUM VOLUME KNOWN GOOD DIE PRODUCT

CROSS REFERENCE TO PRIOR APPLICATIONS

This application is related to Ser. No. (09/164,581), Ser. No. (09/500,507) and Ser. No. (09/431,703), the contents of all of which are incorporated herein by reference.

FIELD OF THE INVENTION

The present invention relates to the handling of the semiconductor devices that have been deemed as "Known Good Die" (KGD) in low and medium volume process flows.

BRIEF DESCRIPTION OF THE PRIOR ART

In the present state of the art, KGD products that are processed in a low and medium volume process flow do not have the proper tooling to insure that the KGD will not be damaged by the handling methods presently in place. Once the die has been tested as good, special handling procedures must be employed to insure that the die remains good and is not damaged during further processing. The handling tools are for low and medium volume KGD product lines where manual and semi-automatic operations are normal procedure.

The most common method of die movement in low and medium volume process flows is to pick the die up on its surface with a vacuum pencil or vacuum pickup tool that exerts contact force upon the top surface of the die (i.e., the surface containing the active and/or passive circuit elements). Occasionally, when the vacuum pickup tool comes into contact with the die, a loose piece of silicon or other hard foreign material may come between the pickup tool and the die surface. This results in a scratch on the surface of the die. Some of the scratches do not damage the underlying layers. However, sometimes the force exerted by the vacuum pickup tool is sufficiently great to cause the scratch to penetrate the protective overcoat on the die and then scratch the underlying metal layers where the metal can be short circuited to adjacent leads or open circuited so that current is not conducted. With the fine line geometries that exist in modern devices, it is impossible to economically visually inspect out the damage that occurs when a die receives a microscratch that bridges or opens the metal. At, for example, 40× and 100× inspection, these product-killing defects are not observable. Many of the microscratches appear to be small, less than a 0.5 mil spot of foreign material upon the die surface. A small spot of foreign material on the die surface is not in itself rejectable since such material can generally be removed. However, if the die is improperly handled after electrical test and microscratches are generated by die topside handling, then the customer would have no recourse but to screen out all anomalies on the die surface because the supplier could not guarantee that the small dots appearing on the die surface were not microscratches instead of foreign material. The visual yield loss due to this lack of confidence in the die handling can be very large, because it is almost impossible to keep small pieces of foreign material off of the KGD surface during the burn-in and testing operations.

When the KGD is shipped to the customer, it is assumed that the product quality is equal to that of a packaged part. If the supplier has handling processes that allow the top of the KGD to be contacted after testing of the KGD, then the possibility of a defect that cannot be screened out has been introduced. The customer of the KGD will also require deployment of soft handling technology in the multichip module (MCM) line to insure product integrity of the KGD. The customer must do this because it is not prepared to electrically screen a KGD.

At the customer's end of the process flow; if the die is not handled with proper precautions, then the customer also can create damage to the KGD that will cause the applications to be unsuccessful. Prior work with KGD and MCM has shown that the largest source of die failure on an MCM is related to the handling of the KGD. The microscratches that have been mentioned are the cause of failures in KGD at the MCM level. The microscratch problem causes yield loss in the MCM assembly and undermines the product integrity of the MCM. The KGD and MCM lines are low volume, generally less than 1,000 units per month or medium volume, generally less than 10,000 units per month, product assembly lines. Most of the suppliers and customers of KGD and MCM product operate in the low and medium volume line configurations. These lines are generally manual or semi-automatic as opposed to substantially fully automated as is the case of high volume devices.

SUMMARY OF THE INVENTION

Special tooling and a new process flow have been developed that insures that the KGD is handled only on the backside or the edge of the die rather than on the front side which contains the active and passive elements. This tooling insures that the die in the wafer form or the die form is not contacted on the surface during processing. This lack of contact prevents the microscratches from occurring in low and medium volume KGD lines. Each step in the handling of the die has been streamlined so that the number of times that the die is to be handled is minimized. The KGD assembly flow and disassembly flow can be used for temporary contact die carriers such as, for example, the Texas Instruments DieMate™ carrier or the KGD using existing process infrastructure approaches.

Each step has unique tools that insure that the principle behind the "soft handling" of not contacting the top surface of the KGD with significant force is maintained initially, the wafer is cleaned, inspected, mounted on a flexible backing and sawed to separate the dice with inspection then taking place in standard manner. The flexible tape is then stretched to provide a space between the dice and a vacuum pencil in accordance with the present invention is then disposed between adjacent dice and under the back side of one of the dice to lift that die and load the die in a test carrier of the type, for example, discussed in the above mentioned application. Testing of the die then takes place in the manner discussed in the above mentioned application while in the test carrier. Dice that test positively are then cleaned, again tested and then placed on an adhesive material, such as, for example, Gel Pac™, all of which is standard in the art, prior to shipment to the customer.

The assembly of the test carrier breaks the wafer down into the semiconductor dice and then loads the dice into the appropriate test carrier. This is accomplished by placing the wafer upon a ring carrier with standard adhesive tape where the wafer can be cleaned, inspected, and sawed in accordance with prior art techniques. Once the wafer has been singulated, special tools that are employed in accordance with the present invention to provide the soft handling flow come into play. The first tool is the vacuum pencil that picks up a die from the backside. The second tool is a tape relief machine which is employed to push the die upward and away from the tape so that the vacuum pencil can slide under the die for removal from the tape. Once the die is pushed up, the vacuum pencil slides under the die and picks it up from the backside. The operator then places the die onto a soft handling carrier. The soft handling carrier is the third unique tool in accordance with the present invention. It is used to transport the bare die around the work area when it is not on the soft handling carrier. This carrier has die positions for locating the die designed to be preferably about 30% larger than the die surface with a corner locating grid for placement accuracy. Between the corner locating grid and the base of the soft handling carrier is a fresh sheet of lint-free paper which is changed with each load and unload operation. The lint-free paper insures that the die has a soft surface against which to be projected. Each grid location on the soft handling carrier has vacuum holes for supporting the top side of the die against the lint-free paper when the die is to be flipped onto the tape. The fourth unique tool in accordance with the present invention is the integrated carrier loading and continuity tester. At the base of the visual loading and aligning machine the die is placed into the test carrier. In a single operation, the die is loaded and checked for continuity before it is processed to the burn-in and test locations. If the die requires reseating in the test carrier, the continuity tester will indicate a failed condition and the loading operator can then remove the test carrier lid and reseat the die. This insures that the loaded test carriers will perform at burn-in and test. Once the dice have completed burn-in and test, they are returned to the assembly location for disassembly, cleanup, inspection, and packing. During the disassembly operation, the die is transported in the soft handling carrier and the ring carrier with tape. The fifth unique tool in accordance with the present invention that is required is the disassembly tool. This tool removes the lid and picks the die out of the test carrier. This tool is known as the lid and die removal tool. The ring lock must be removed from the carrier in a vertical motion so that the underlying die receives no torquing force that could result in scratching the top surface of the die. Once the ring lock or lid for the test carrier is removed, then the die is picked up and replaced in the soft handling carrier. Once in the soft handling carrier, the die can be moved onto the ring carrier with tape and processed through cleanup and inspection. The dice are removed from the tape with the tape relief machine and backside vacuum pencil. They are then placed into Gel Pac™ for shipment to the customer.

In accordance with the present invention, the dice are picked up and handled from the backside or edge of the KGD. In the prior art solutions, pickup mechanisms come into contact with the top surface of the die and care is not taken in the mechanics of the flow to insure that the top surface of the die receives no mechanical force at the critical operations where damage is likely to occur. Damage is usually in the form of a microscratch between two lines or an opening in a conductive line. The microscratch occurs as a result of point damage due to the force being exerted during pickup from the topside of the die. The present invention also combines the die loading and continuity checks in one single operation.

The dice that receive the soft handling flow will have a greater level of quality in the KGD format when inspection is performed on the bare die after test because the flow minimizes mechanical damage as a concern in the processing of the die and the die shipped to the customer will not be suspect of mechanical damage. The KGD produced with soft handling has a greater level of outgoing quality. The MCM yields and product integrity are greater as a result of soft handling.

BRIEF DESCRIPTION OF THE DRAWINGS

FIG. 3b is an enlarged view of the pin portion of FIG. 3a; an

FIG. 4 is a perspective view of a soft handling carrier in accordance with the present invention.

DESCRIPTION OF THE PREFERRED EMBODIMENT

Figure 1A:
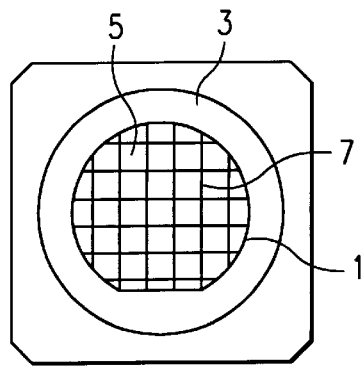
FIGS. 1a and 1b are a partial process flow which describe how the five tools of the present invention are used to handle the die in the post wafer probe operation to the die pack operation.
Figure 1B:
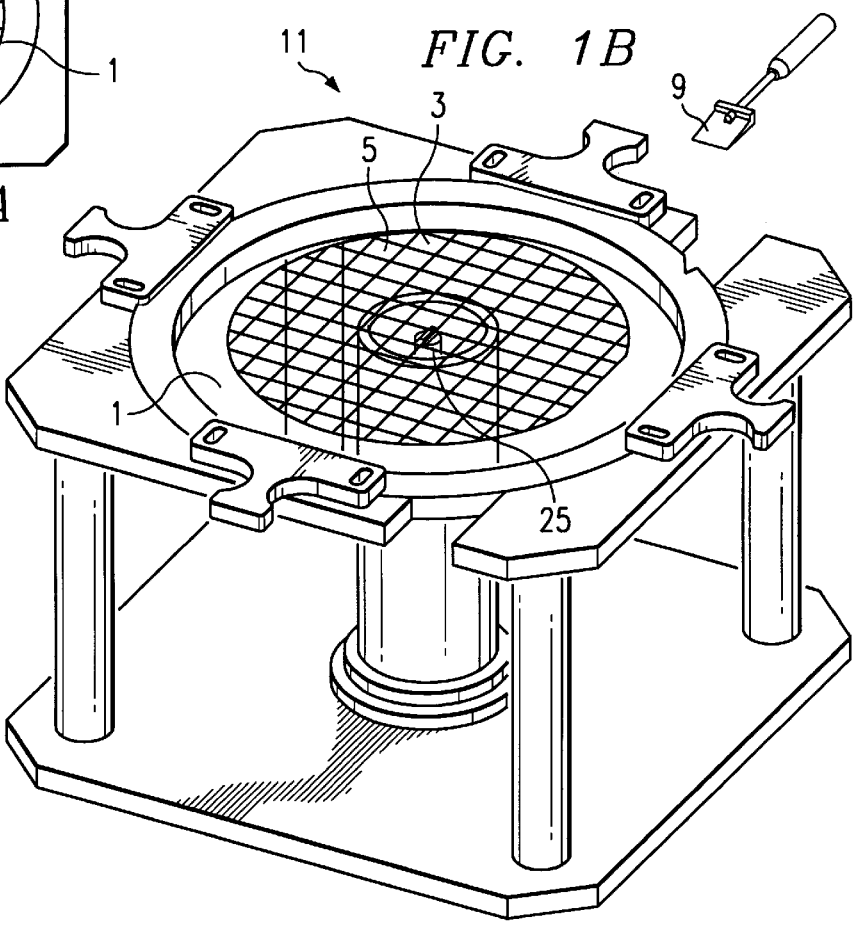

Referring to FIG. 1a, a wafer 1 is provided which is initially cleaned, inspected under a microscope, mounted on an adhesive stretchable tape 3 sawed to separate the dice 5 on the wafer with reinspection in accordance with the prior art. The tape is then stretched to space apart the adjacent dice 5 from each other and provide streets 7 between the dice for entrance of a vacuum pencil 9 (shown in FIG. 1b) along a street and under a die. The vacuum pencil 9 is then disposed under the backside of a die 5 with the die being removably secured to the pencil by a vacuum created at the pencil surface. This action is assisted by a die push up mechanism 11 which is disposed beneath the tape and is movable relative to the tape to lift up the side of the die being removed under which the pencil will travel as shown in FIG. 1b. The action of the die push up mechanism is preferably accomplished by moving a needle or pin from below the tape 3 through the tape and against the backside of the die being removed. The pencil is then lifted to remove the die 5 from the tape. While the discussion shows that die removal can commence with a totally surrounded die, it should be understood that, as a practical matter, it would generally be advisable to start with a peripherally located die rather than a centrally located die and continue to operate on peripherally located dice.

Figure 2:
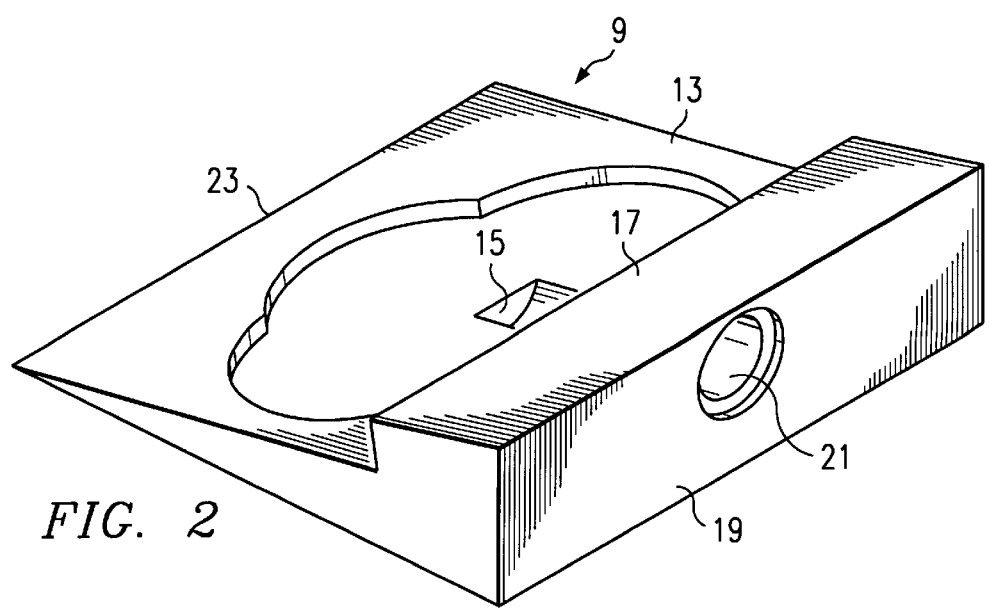
FIG. 2 is a perspective view of a backside vacuum pencil tip in accordance with the present invention.

Referring to FIG. 2, there is shown the vacuum pencil 9 in accordance with the present invention. The vacuum pencil 9 includes an inclined upper surface 13 having a port 15 in the upper surface and a ridge 17 to prevent override of the die on the inclined surface. The rear wall 19 of the pencil includes a port 21 which communicates with the port 15. A handle (shown in FIG. 1b) is secured within the port 21 and includes therein a pathway for providing a vacuum at the port 15 to removably secure a die to the inclined surface when the die is disposed on the inclined surface. In operation, the front edge 23 of the pencil is disposed in the street between a pair of dice 5 or under the exposed side of a peripheral die 5 and run under the backside of the die to be removed after the die has been moved upwardly by the die pick up mechanism, at least until the die rests over the port 15 whereupon a vacuum has been created, and is thereby secured to the inclined surface 13 of the pencil. The pencil is then lifted up to remove the die 5 from the tape without contacting the upper die surface.

Figure 3A:
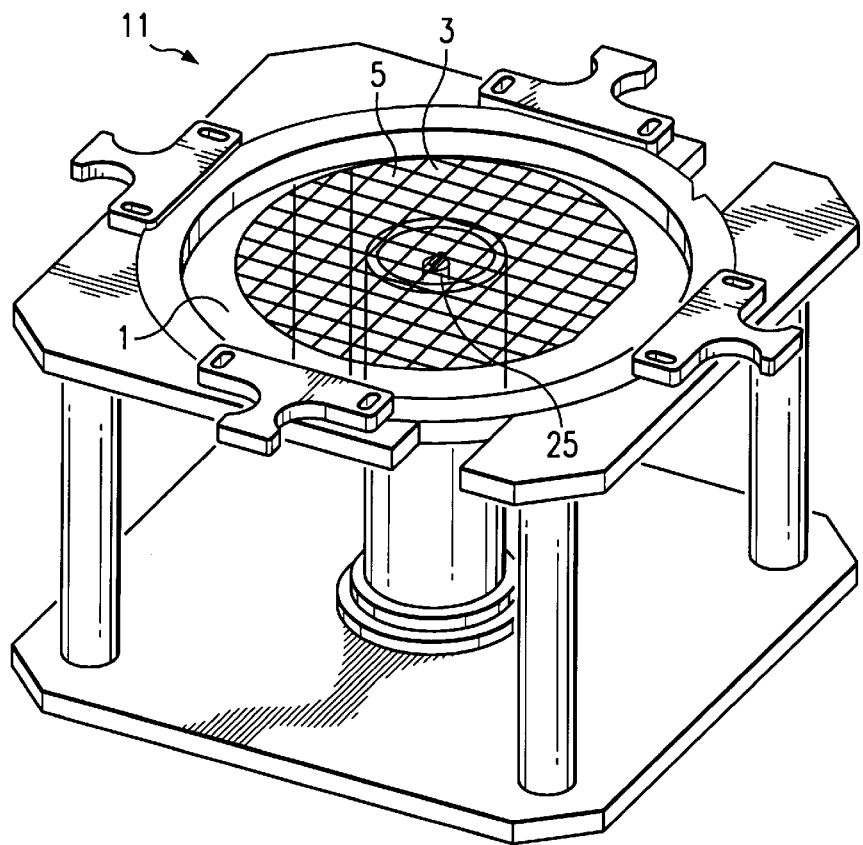
FIG. 3a is a perspective view of a tape relief and die pushup mechanism in accordance with the present invention.
Figure 3B:
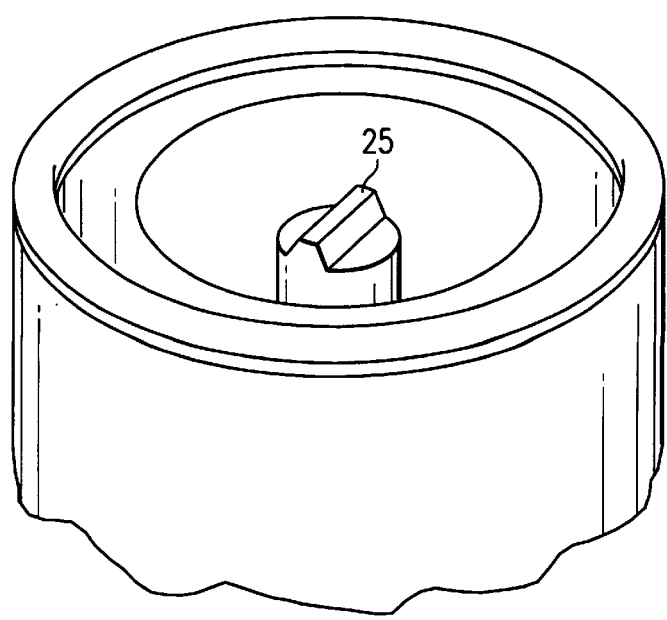

Referring to FIG. 3a, there is shown the die pick up mechanism 11 disposed beneath the tape 1 and wafer 3. This tool is used for handling the KGD from operation to operation. The pin 25 is positioned beneath the die to be removed and moved upwardly sufficiently to lift the edge of the die under which the pencil will enter away from the tape 1 to allow easy entry of the pencil under the die. This enables the holder to slide under the KGD and push up the die at an angle to the tape 1 before the backside surface is exposed to the package pencil. The die step at the head of the top is for alignment of the die for easy pickup by the pencil. This tool 11 is used to hold the sawed wafer in place and push the die 5 upward so that the KGD can be removed from the tape and pushed up on the backside of the die. The push up pin 25 is curved at the tip as shown in FIG. 3b for slanting the die so that the backside vacuum pencil top can be used behind the die.

The dice 5 are then loaded onto a soft handling tool, one at a time. This is accomplished with reference to FIG. 4 by providing a soft handling carrier which includes a base 31 having a surface 33 containing a plurality of vacuum ports 35 in a matrix array with a vacuum source outlet (not shown) in the base communicating with all of the vacuum ports. A piece of air permeable, lint-free paper 37 is disposed over the surface 33 and a wire mesh 39 dimensioned to accommodate the dice 5 within the mesh is disposed over the lint-free paper. The pencil 9 is then positioned to place the die 5 attached thereto, topside down, onto the lint-free paper 37 and the vacuum is removed from the pencil while the vacuum is present in the base 31 so that the dice become removably secured to the base 35 over the lint-free paper. The tool of FIG. 4 with dice 5 loaded therein is an intermediary storage for the dice prior to subsequent operation thereon. Since the dice are stored in the inverted state, the dice can now be lifted from the backside or from the sides without contact to the front side or subjection to contamination due to having the front side facing upward or requiring flipping over for subsequent operation thereon.

The die 5 is then placed in a die test carrier and optically aligned therein in accordance with prior art techniques. The die test carrier is placed in a continuity checker also provided with a test for electrical continuity prior to final test to insure that all electrical connections are properly in place. It can be seen that die loading and continuity checking take place in one operation. This tool is used to remove the lid from the test carrier, with an upward movement away from the test carrier base. Then in a similar motion, the KGD is picked up from the backside and placed into the soft handling tool for further processing, cleanup and inspection. The dice then go to burn in and further test after burn in whereupon the dice are unloaded with the vacuum pencil on the backside, loaded on a tape, inspected and packed in standard manner for shipment.

Though the invention has been described with reference to specific preferred embodiments thereof, many variations and modification will immediately become apparent to those skilled in the art. It is therefore the intention that the appended claims be interpreted as broadly as possible in view of the prior art to include all such variations and modifications.

What is claimed is:

1. A method of transferring a semiconductor die from a wafer containing a plurality of semiconductor dice which comprises the steps of:
   (a) providing a semiconductor wafer having a top side and an opposing bottom side and having a plurality of dice formed therein and containing a portion of said top side and said opposing bottom side;
   (b) removably securing said wafer to a support;
   (c) operating on said wafer to form individual dice on said support;
   (d) disposing a tool between said support and the bottom side of said die by creating a vacuum between said tool and said bottom side to cause adherence of said die to said tool; and
   (e) removing said die from said support with said tool.

2. The method of claim 1 further including the step of placing said die in a die carrier with said top side facing said carrier and then releasing said vacuum.

3. The method of claim 2 wherein said tool includes an inclined surface with a port exiting at said surface extending through and out of said tool, said vacuum being created at said port, said inclined surface contacting said bottom side of said die.

4. The method of claim 3 further including prior to step (c) of applying a lifting member through said support and against said bottom side of said die to separate a portion of said die from said support, said tool entering beneath said die at said portion of said die removed from said support.

5. The method of claim 2 further including prior to step (c) of applying a lifting member through said support and against bottom side of said die to separate a portion of said die from said support, said tool entering beneath said die at said portion of said die removed from said support.

6. The method of claim 5 wherein step (e) includes providing a carrier base having a plurality of vacuum ports and applying an air transmissive lint-free layer over said vacuum ports, said top side of said die abutting said lint-free layer, said die being disposed over one of said vacuum ports.

7. The method of claim 2 wherein step (e) includes providing a carrier base having a plurality of vacuum ports and applying an air transmissive lint-free layer over said vacuum ports, said top side of said die abutting said lint-free layer, said die being disposed over one of said vacuum ports.

8. The method of claim 1 wherein said support is a flexible film, further including after step (c) the step of stretching said support to separate said dice from each other and create streets between adjacent dice, said tool being disposed under said die from said street.

9. The method of claim 8 wherein said tool includes an inclined surface with a port exiting at said surface extending through and out of said tool, said vacuum being created at said port, said inclined surface contacting said bottom side of said die.

10. The method of claim 9 further including prior to step (c) of applying a lifting member through said support and against said bottom side of said die to separate a portion of said die from said support, said tool entering beneath said die at said portion of said die removed from said support.

11. The method of claim 10 wherein step (e) includes providing a carrier base having a plurality of vacuum ports and applying an air transmissive lint-free layer over said vacuum ports, said top side of said die abutting said lint-free layer, said die being disposed over one of said vacuum ports.

12. The method of claim 9 wherein step (e) includes providing a carrier base having a plurality of vacuum ports and applying an air transmissive lint-free layer over said vacuum ports, said top side of said die abutting said lint-free layer, said die being disposed over one of said vacuum ports.

13. The method of claim 8 further including prior to step (c) of applying a lifting member through said support and against said bottom side of said die to separate a portion of said die from said support, said tool entering beneath said die at said portion of said die removed from said support.

14. The method of claim 1 wherein said tool includes an includes an inclined surface with a port exiting at said surface extending through and out of said tool, said vacuum being created at said port, said inclined surface contacting said bottom side of said die.

15. The method of claim 14 further including prior to step (c) of applying a lifting member through said support and against said bottom side of said die to separate a portion of said die from said support, said tool entering beneath said die at said portion of said die removed from said support.

16. The method of claim 15 wherein step (e) includes providing a carrier base having a plurality of vacuum ports and applying an air transmissive lint-free layer over said vacuum ports, said top side of said die abutting said lint-free layer, said die being disposed over one of said vacuum ports.

17. The method of claim 14 wherein step (e) includes providing a carrier base having a plurality of vacuum ports and applying an air transmissive lint-free layer over said vacuum ports, said top side of said die abutting said lint-free layer, said die being disposed over one of said vacuum ports.

18. The method of claim 1 further including prior to step (c) of applying a lifting member through said support and against said bottom side of said die to separate a portion of said die from said support, said tool entering beneath said die at said portion of said die removed from said support.

* * * * *